United States Patent
He et al.

(10) Patent No.: US 7,492,155 B2
(45) Date of Patent: Feb. 17, 2009

(54) METHOD AND APPARATUS FOR PHASE CALIBRATION OF AN MRI PULSE

(75) Inventors: Qiang He, Shenzhen (CN); Peter Heubes, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/834,106

(22) Filed: Aug. 6, 2007

(65) Prior Publication Data

US 2008/0036460 A1   Feb. 14, 2008

(30) Foreign Application Priority Data

Aug. 8, 2006   (CN) ................. 2006 1 0089180

(51) Int. Cl.
*G01V 3/00* (2006.01)

(52) U.S. Cl. ........................ 324/309; 324/307

(58) Field of Classification Search ......... 324/300–322; 600/407–422
See application file for complete search history.

(56) References Cited

U.S. PATENT DOCUMENTS

| 5,537,039 | A  | * | 7/1996 | Le Roux et al. | 324/309 |
| 6,289,232 | B1 | * | 9/2001 | Jakob et al. | 600/410 |
| 6,469,505 | B1 | * | 10/2002 | Maier et al. | 324/309 |
| 6,528,998 | B1 | * | 3/2003 | Zhou et al. | 324/309 |

* cited by examiner

*Primary Examiner*—Brij B Shrivastav
(74) *Attorney, Agent, or Firm*—Schiff Hardin LLP

(57) ABSTRACT

The present invention concerns a method and an apparatus for phase-calibrating an MRI pulse sequence which is used to calculate a linear phase and a constant phase to perform phase calibration on the scanned data, wherein a corresponding pre-scan without a phase encoding gradient is performed before a diagnostic scan. A reference echo is selected from the echoes obtained in the pre-scan. On the basis of the reference echo the constant phase is calculated to be used in performing the phase calibration in the scan. The constant phase that is obtained is correct and not affected by phase jumping. A further image reconstruction performed on the phase-calibrated data produces clear and artifact-free images.

10 Claims, 1 Drawing Sheet

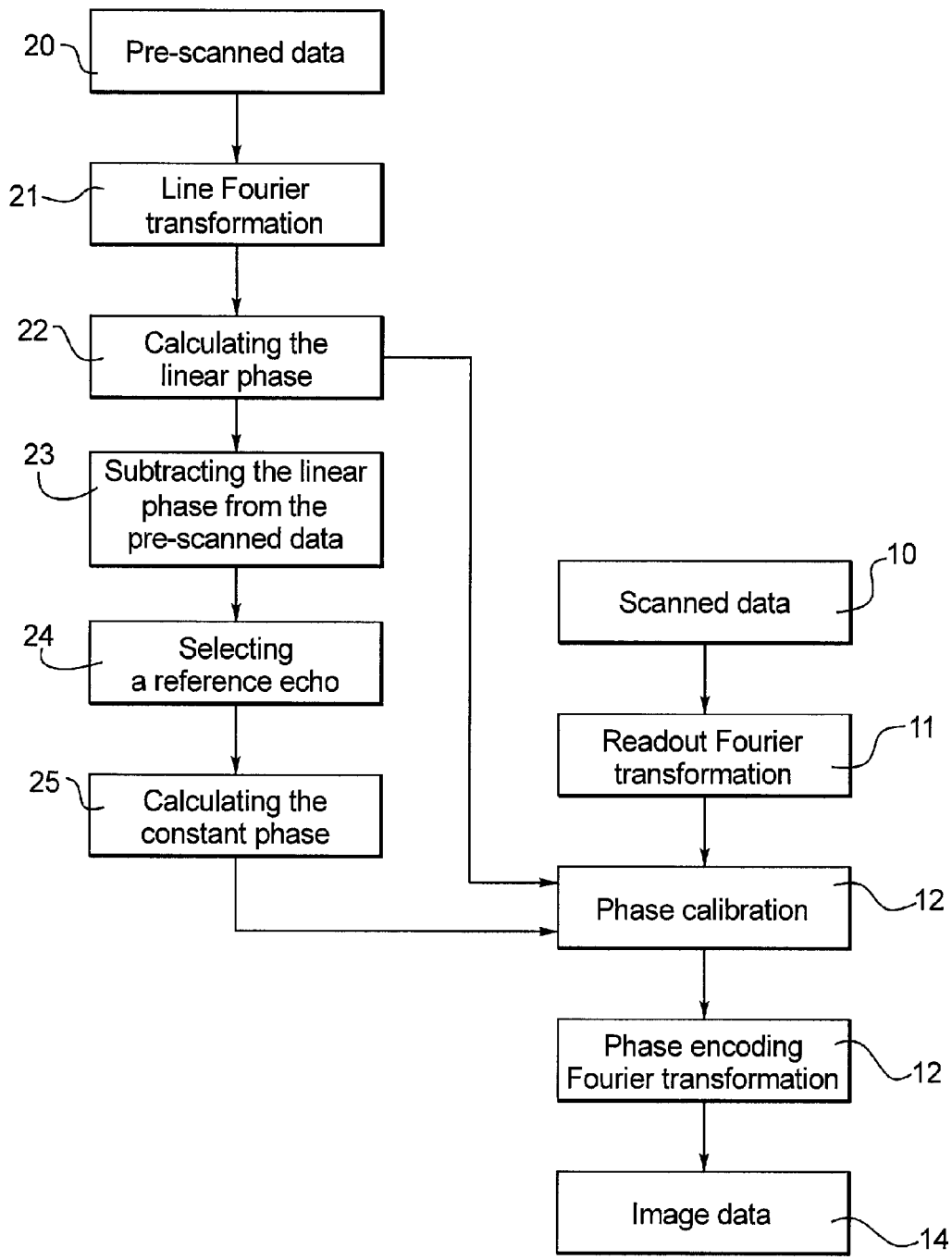

METHOD AND APPARATUS FOR PHASE CALIBRATION OF AN MRI PULSE

BACKGROUND OF THE INVENTION

1. Field of the Invention

The present invention relates to a pulse sequence in Magnetic Resonance Imaging (MRI), and particularly to a method and an apparatus for calibrating an MRI pulse sequence.

2. Description of the Prior Art

An imaging sequence in MRI, particularly fast sequences, sometimes can be affected by a system's imperfect performance, such as eddy currents, insufficient radio frequency power, etc., and the system's physical characteristics, such as RF penetration in a high field strength MRI system. In a high field strength MRI system, the RF penetration can induce phase jumping, thereby leading to errors in phase calibration, which in turn leads to unclear images and the generation of imaging artifacts.

Referring to FIG. 1, a current method for performing phase calibration on scanned data includes the following steps:

step 10: acquiring scanned data and entering the scanned data into k-space;

step 20: reading out the scanned data line-by-line from k-space and obtained the Fourier transformation thereof;

step 30: performing phase calibration on the data obtained by the transformation; wherein the phase calibration includes a constant phase calibration and a linear phase calibration;

step 40: Fourier transforming the phase-calibrated data; and step 50: reconstructing an image using the phased-calibrated data.

In a practical conventional system, a common practice is to perform the calibration only to the linear phase and usually a calibration to the constant phase is skipped. However, since the phase jumping induced by the RF penetration mainly results in errors in the constant phase, it is necessary to perform calibration to the constant phase.

SUMMARY OF THE INVENTION

An object of the present invention is to provide a method for phase calibration of an MRI pulse sequence and an apparatus for implementing such a method, so as to perform the phase calibration on scanned data by using correct constant phase.

The above object is achieved in accordance with the present invention by a method for phase-calibrating an MRI pulse sequence, wherein a linear phase and a constant phase are calculated so as to perform the phase calibration on the scanned data, wherein a corresponding pre-scan without a phase encoding gradient is performed before starting a scan, one of the echoes obtained in the pre-scan is selected as a reference echo, and on the basis of the reference echo the constant phase is calculated so as to be used for performing phase calibration to the scan.

The number of the lines of the data obtained in the pre-scan equals that obtained in the scan. Line Fourier transformation is performed on the pre-scanned data in the k-space data set. Then the constant phase is calculated on the basis of the reference echo after having subtracted the linear phase from the k-space data set. Preferably the first echo obtained in the pre-scan is selected as the reference echo. The constant phase is obtained by calculating the correlation between the reference echo and an echo in the pre-scan corresponding to an echo in the scan on which the phase calibration is to be performed.

The above object also is achieved in accordance with the present invention by an apparatus for phase-calibrating an MRI pulse sequence, which calculates a linear phase and a constant phase so as to perform phase calibration on the scanned data. The apparatus has a scan module for acquiring the scanned data, the module having a phase calibration module for calibrating the phase of echoes on the basis of the linear phase and the constant phase. The apparatus further has a pre-scan module for performing a corresponding pre-scan without a phase encoding gradient before starting a scan, with one of the echoes obtained in the pre-scan being selected as a reference echo. The constant phase is obtained by calculating the correlation between the reference echo and an echo in the pre-scan corresponding to an echo in the scan on which the phase calibration is to be performed, and the constant phase is used in the phase calibration module to perform phase calibration on a corresponding echo.

After the phase calibration is performed on the scanned data by using the method and apparatus of the present invention, the constant phase obtained is correct and not affected by the phase jumping, and further image reconstruction is performed on the phase-calibrated data so as to obtain clear and artifact-free images.

The method of the present invention can be widely utilized in various types of MRI pulse sequences, particularly a TSE (Turbo Spin Echo) sequence, an EPI (Echo Planar Imaging) sequence or a Trui-IR (overturn recover) sequence.

BRIEF DESCRIPTION OF THE DRAWINGS

The single FIGURE is a flowchart for phase calibration of MRI pulse sequence in accordance with the present invention.

DESCRIPTION OF THE PREFERRED EMBODIMENTS

Referring to FIG. 1, the method for phase calibration of an MRI pulse sequence of the present invention includes the following steps:

Step 20: A corresponding pre-scan without a phase encoding gradient is performed before a scan so as to obtain pre-scan data, and the number of lines of data obtained in the pre-scan equals to that obtained in the scan. The difference between the pre-scan and the diagnostic scan is only with or without the phase encoding gradient, and the amounts of the scanned data obtained from the two are equal; whatever number of echoes are obtained in the scan, there would be the same number of corresponding echoes obtained in the pre-scan.

Step 21: Linear Fourier transformation is performed on the pre-scanned data to produce a corresponding k-space data set. The linear Fourier transformation preferably is a linear fast Fourier transformation.

Step 22: The linear phase is calculated according to the following formula:

$$[Re + i Im]_k = \sum_{n=1}^{N-1} [Re(n+1) + i Im(n+1)]_k \cdot [Re(n) - i Im(n)]_k$$

wherein k represents the k-th echo in the pre-scan, Re and Im represent the real part and the imaginary part respectively, N represents the number of sampling points in each line of data in k-space, and n represents the n-th sampling point of each line in the k-space.

The linear phase is derived as:

$$\phi_l(k) = a\tan(Im, Re)$$

Step 23: After having subtracted the linear phase from the k-space of the pre-scanned data, the constant phase is calculated on the basis of the reference echo.

Step 24: The selection of the reference echo: in a practical system, the first echo obtained in the pre-scan is usually selected as the reference echo.

Step 25: The relevance between the reference echo and the echo in the pre-scan corresponding to the echo in the scan on which phase calibration is to be performed is calculated:

$$[Re + iIm]_{k,l} = \sum_{n=1}^{N-1} [Re(n) + iIm(n)]_k \cdot [Re(n) - iIm(n)]_l$$

wherein k represents the k-th echo in the pre-scan, l represents the reference echo, Re and Im represent a real part and an imaginary part respectively, N represents the number of sampling points in each line of data in the k-space, and n represents the n-th sampling point in each line in the k-space.

The constant phase is derived as:

$$\phi_c(k) = a\tan 2(Im, Re).$$

By this point, the calculation on the pre-scanned data has produced the linear phase, and the constant phase which is correct and not affected by the phase jumping; therefore they can be used in a corresponding scan for phase calibration.

A corresponding phase calibration is performed on a corresponding echo obtained in a scan according to the following formula:

$$Ae^{i\phi_f} = Ae^{i\phi_b} Ae^{i\phi_l} Ae^{i\phi_c}$$

wherein A represents the amplitude, $\phi_f$ represents data after the phase calibration, $\phi_b$ represents data before the phase calibration, $\phi_l$ and $\phi_c$ represent respectively the linear phase and the constant phase calculated in the pre-scan.

Clear and artifact-free images can be obtained by image reconstruction on the data after they have been phase-calibrated.

The method of the present invention can be widely used in various types of MRI pulse sequences, particularly a TSE (Turbo Spin Echo) sequence an EPI (Echo Planar Imaging) sequence or an Trui-IR (overturn recover) sequence.

The present invention also embodies an apparatus for phase calibration of an MRI pulse sequence, which calculates a linear phase and a constant phase so as to perform phase calibration on the scanned data. A scan module acquires the scanned data, this module having a phase calibration module for calibrating the phase of echoes on the basis of the linear phase and the constant phase. The apparatus further has a pre-scan module for performing a corresponding pre-scan without a phase encoding gradient before starting a diagnostic scan. One of the echoes obtained in the pre-scan is selected as a reference echo. The constant phase is obtained by calculating the correlation between the reference echo and an echo in the pre-scan corresponding to an echo in the scan on which the phase calibration is to be performed, and the constant phase is used in the phase calibration module to perform phase calibration on a corresponding echo.

Although modifications and changes may be suggested by those skilled in the art, it is the intention of the inventors to embody within the patent warranted hereon all changes and modifications as reasonably and properly come within the scope of his contribution to the art.

We claim as our invention:

1. A method for phase-calibrating an MRI pulse sequence comprising the steps of:

before conducting a diagnostic scan, including generating a phase encoding gradient, to obtain a diagnostic MRI data, conducting a pre-scan corresponding to said diagnostic scan but without generating said phase encoding gradient, in which a plurality of echoes are obtained and data corresponding to said echoes are entered in a plurality of lines of k-space;

selecting one of said echoes obtained in said pre-scan as a reference echo;

using said reference echo, automatically electronically calculating a linear phase and a constant phase; and calibrating said diagnostic scan using said linear phase and said constant phase to produce a calibrated diagnostic scan, and executing said calibrated diagnostic scan to obtain diagnostic MRI data for a plurality of lines in k-space equal to the plurality of lines of k-space in space pre-scan.

2. A method as claimed in claim 1, comprising line Fourier transforming said pre-scanned data.

3. A method as claimed in claim 2 comprising executing said linear Fourier transformation as a line fast Fourier transformation.

4. A method as claimed in claim 2 comprising calculating said linear phase according to the formula:

$$[Re + iIm]_k = \sum_{n=1}^{N-1} [Re(n+1) + iIm(n+1)]_k \cdot [Re(n) - iIm(n)]_k$$

wherein k represents a $k^{th}$ echo obtained in said pre-scan, Re and Im respectively represent a real part and an imaginary part, N represents a number of sampling points in each line in k-space, and n represents and $n^{th}$ sampling point in each of said lines in k-space; and calculating said linear phase as:

$$\phi_l(k) = a\tan(Im, Re).$$

5. A method as claimed in claim 4 comprising calculating said constant phase dependent on said reference echo after subtracting said linear phase from k-space.

6. A method as claimed in claim 4 wherein said plurality of echoes obtained in said pre-scan include a first echo, and selecting said first echo as said reference echo.

7. A method as claimed in claim 5 comprising calculating a correlation between said reference echo and an echo in said pre-scan corresponding to an echo in said diagnostic scan according to the formula:

$$[Re + iIm]_{k,l} = \sum_{n=1}^{N-1} [Re(n) + iIm(n)]_k \cdot [Re(n) - iIm(n)]_l$$

wherein k represents a $k^{th}$ echo in said pre-scan, l represents said reference echo, Re and Im respectively represent a real part and an imaginary part, N represents a number of sampling points in each line of k-space, and $n^{th}$ represents an nth sampling point in each line in k-space; and calculating said constant phase as:

$$\phi_c(k) = a\tan 2(Im, Re).$$

8. A method as claimed in claim 7 comprising calibrating said echoes in said diagnostic scan according to:

$$Ae^{i\phi_f} = Ae^{i\phi_b} Ae^{i\phi_l} Ae^{i\phi_c};$$

wherein A represents amplitude, $\phi_f$ represents data obtained after phase calibration, $\phi_b$ represents data before the phase calibration, $\phi_l$ and $\phi_c$ respectively represent the linear phase and the constant phase from said pre-scan.

9. A method as claimed in claim 1 comprising selecting said diagnostic scan as a pulse sequence selected from the group consisting of TSE sequences, EPI sequences, and Trui-IR sequences.

10. A magnetic resonance imaging (MRI) system comprising:
- an MRI scanner configured to interact with a subject to acquire MRI data;
- a control unit that operates said MRI scanner by, before conducting a diagnostic scan, including generating a phase encoding gradient, to obtain a diagnostic MRI data, conducting a pre-scan, corresponding to said diagnostic scan but without generating said phase encoding gradient, in which a plurality of echoes are obtained and data corresponding to said echoes are entered in a plurality of lines of k-space;
- said control unit being configured to select one of said echoes obtained in said pre-scan as a reference echo, and to use said reference echo to automatically electronically calculate a linear phase and a constant phase; and
- said control unit also configured to calibrate said diagnostic scan using said linear phase and said constant phase to produce a calibrated diagnostic scan, and to operate said MRI scanner to execute said calibrated diagnostic scan to obtain diagnostic MRI data for a plurality of lines in k-space equal to the plurality of lines of k-space in space pre-scan.

* * * * *